(12) United States Patent  (10) Patent No.: US 8,262,263 B2
Dinh  (45) Date of Patent: Sep. 11, 2012

(54) HIGH RELIABILITY COOLING SYSTEM FOR LED LAMPS USING DUAL MODE HEAT TRANSFER LOOPS

(76) Inventor: Khanh Dinh, Gainesville, FL (US)

( * ) Notice: Subject to any disclaimer, the term of this patent is extended or adjusted under 35 U.S.C. 154(b) by 347 days.

(21) Appl. No.: 12/271,897

(22) Filed: Nov. 16, 2008

(65) Prior Publication Data

US 2009/0126905 A1    May 21, 2009

Related U.S. Application Data

(60) Provisional application No. 61/003,548, filed on Nov. 16, 2007.

(51) Int. Cl.
*F21V 29/00* (2006.01)
(52) U.S. Cl. .................... 362/373; 362/294; 165/104.21; 165/104.33
(58) Field of Classification Search .................. 362/294, 362/373; 165/104.21, 80.3, 104.33, 104.26; 361/677, 679.52–679.53, 689, 698, 700
See application file for complete search history.

(56) References Cited

U.S. PATENT DOCUMENTS

| | | | |
|---|---|---|---|
| 4,607,498 A | 8/1986 | Dinh | |
| 4,724,901 A * | 2/1988 | Munekawa | 165/104.21 |
| 4,827,733 A | 5/1989 | Dinh | |
| 4,938,035 A | 7/1990 | Dinh | |
| 5,168,919 A * | 12/1992 | Berenholz et al. | 165/80.4 |
| 5,269,151 A | 12/1993 | Dinh | |
| 5,316,075 A | 5/1994 | Quon et al. | |
| 5,316,078 A * | 5/1994 | Cesaroni | 165/104.33 |
| 5,333,470 A | 8/1994 | Dinh | |
| 5,394,040 A | 2/1995 | Khanh | |
| 5,404,938 A | 4/1995 | Dinh | |
| 5,448,897 A | 9/1995 | Dinh | |
| 5,564,184 A | 10/1996 | Dinh | |
| 5,582,246 A | 12/1996 | Dinh | |
| 5,749,415 A | 5/1998 | Dinh | |
| 5,785,418 A * | 7/1998 | Hochstein | 362/373 |

(Continued)

FOREIGN PATENT DOCUMENTS

WO    WO2006023149 A2    3/2006

(Continued)

OTHER PUBLICATIONS

International Search Report & Written Opinion of the Int'l searching authority in PCT/US2009/064108, Jan. 6, 2010.

*Primary Examiner* — Robert May
(74) *Attorney, Agent, or Firm* — Mai-Tram D. Lauer; Westman, Champlin & Kelly, P.A.

(57) ABSTRACT

In one aspect, a cooling device for an LED chip mounted on a heat sink includes an enclosed tube in contact with the heat sink. The tube includes a vacuum section surrounded by a plurality of cooling fins and a liquid-filled section surrounded by a plurality of cooling fins. The liquid-filled section is in contact with the heat sink. In another aspect, an apparatus includes a heat sink, an LED chip mounted on the heat sink, and an enclosed tube in contact with the heat sink. The tube includes a vacuum section surrounded by a plurality of cooling fins and a liquid-filled section surrounded by a plurality of cooling fins. The liquid-filled section is in contact with the heat sink.

12 Claims, 9 Drawing Sheets

U.S. PATENT DOCUMENTS

| | | | |
|---|---|---|---|
| 5,845,702 A | 12/1998 | Dinh | |
| 5,890,794 A * | 4/1999 | Abtahi et al. | 362/294 |
| 5,921,315 A | 7/1999 | Dinh | |
| 6,055,154 A | 4/2000 | Azar | |
| 6,227,686 B1 * | 5/2001 | Takahashi et al. | 362/345 |
| 6,474,074 B2 | 11/2002 | Ghoshal | |
| 6,517,221 B1 * | 2/2003 | Xie | 362/373 |
| 6,615,912 B2 * | 9/2003 | Garner | 165/104.26 |
| 6,742,284 B2 | 6/2004 | Dinh | |
| 6,745,830 B2 | 6/2004 | Dinh | |
| 6,910,794 B2 | 6/2005 | Rice | |
| 6,926,072 B2 | 8/2005 | Wert | |
| 6,956,740 B2 * | 10/2005 | Shimura et al. | 361/700 |
| 7,210,832 B2 * | 5/2007 | Huang | 362/547 |
| 7,508,662 B2 * | 3/2009 | Chang | 361/679.52 |
| 7,547,124 B2 * | 6/2009 | Chang et al. | 362/373 |
| 7,753,568 B2 * | 7/2010 | Hu et al. | 362/373 |
| 2002/0074108 A1 | 6/2002 | Khrustalev | |
| 2004/0095747 A1 * | 5/2004 | Taylor | 362/92 |
| 2004/0196653 A1 * | 10/2004 | Clark et al. | 362/183 |
| 2005/0172644 A1 | 8/2005 | Zhang | |
| 2006/0133090 A1 * | 6/2006 | Noh et al. | 362/294 |
| 2008/0110599 A1 | 5/2008 | Reyzin | |
| 2008/0150758 A1 | 6/2008 | Vallejo | |
| 2008/0175008 A1 | 7/2008 | Hu | |
| 2010/0073642 A1 * | 3/2010 | Sueoka | 353/54 |

FOREIGN PATENT DOCUMENTS

| | | |
|---|---|---|
| WO | WO2006023149 A3 | 3/2006 |

* cited by examiner

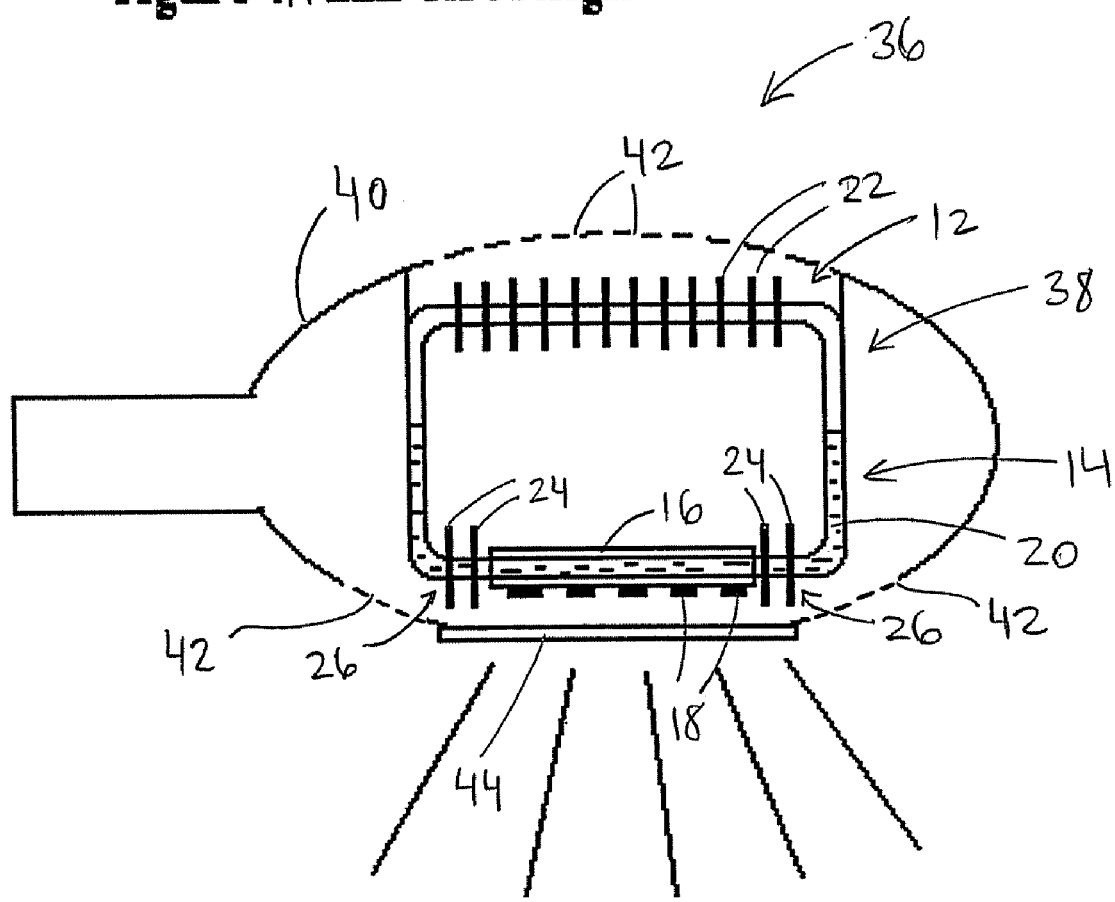
Figure 4A LED streetlight

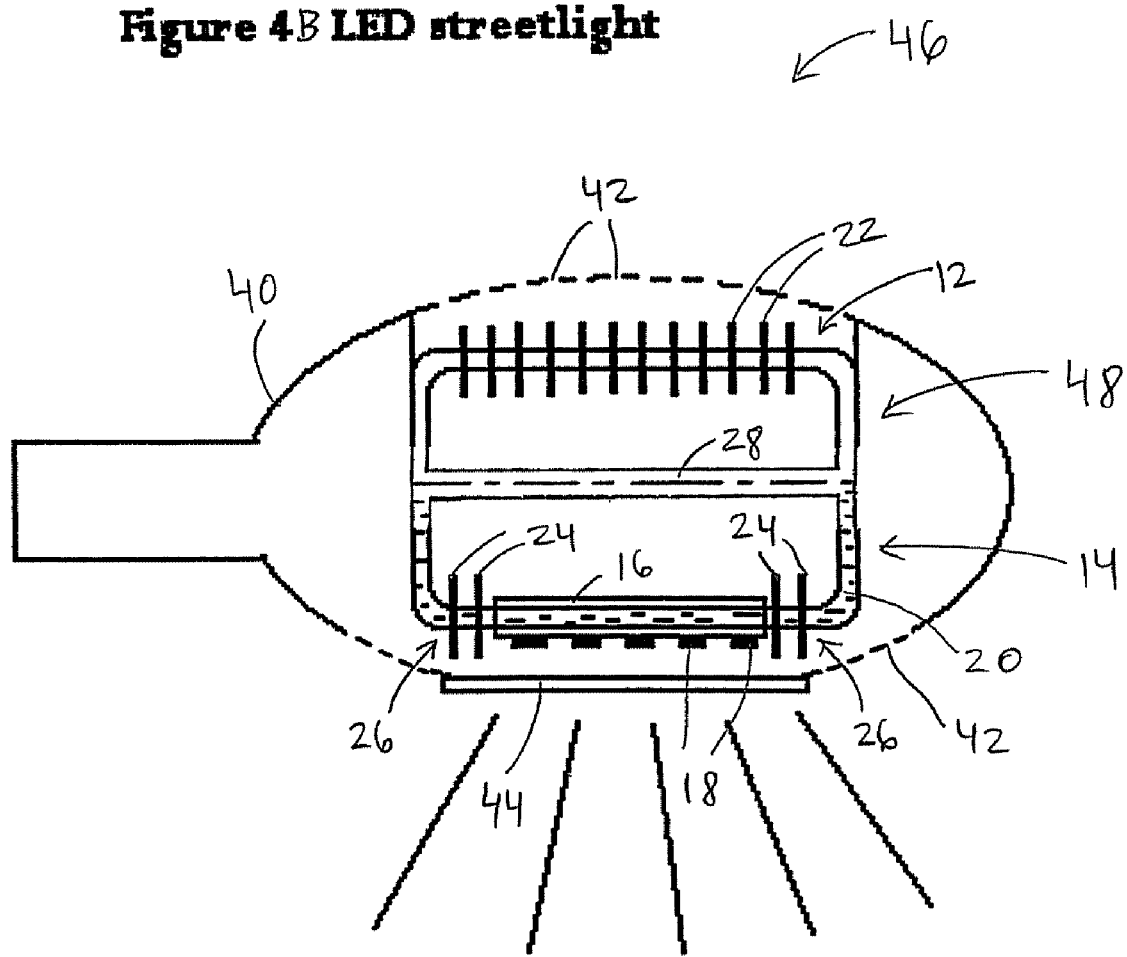
Figure 4B LED streetlight

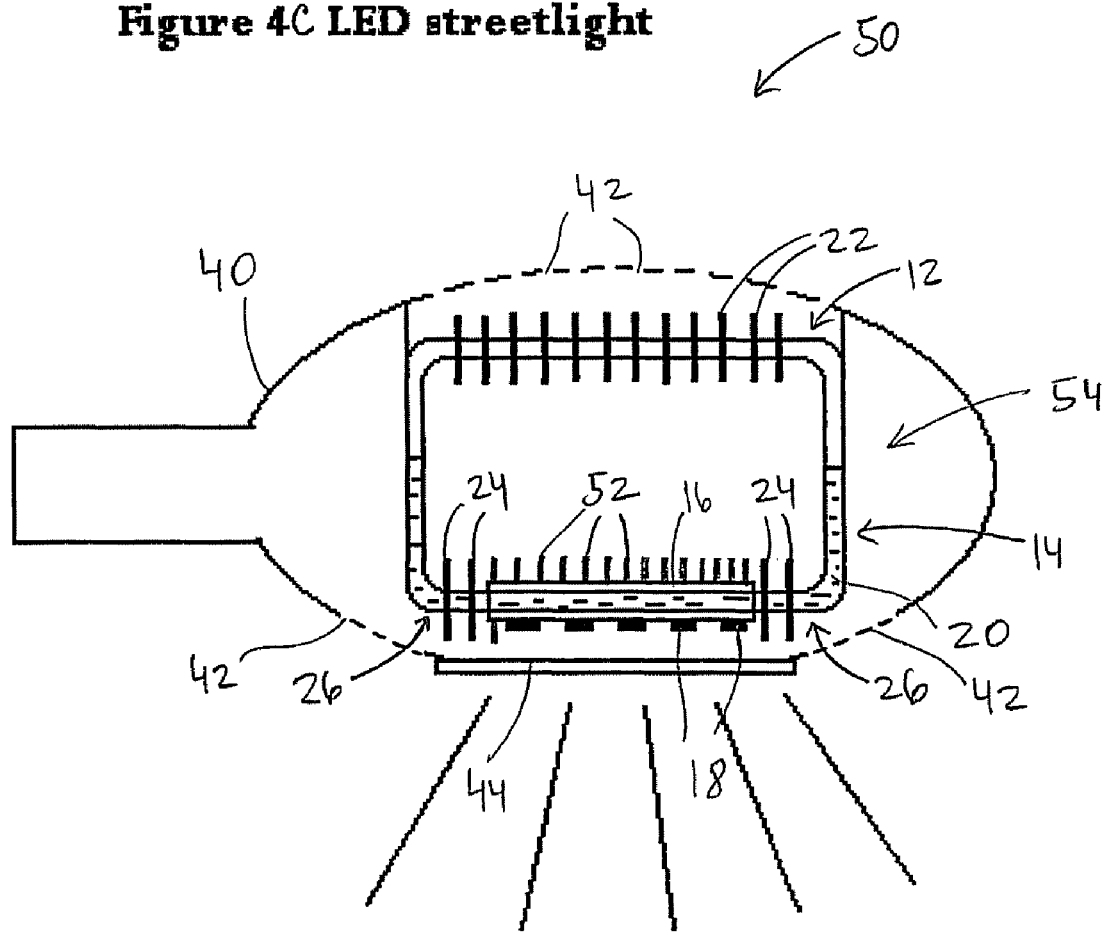

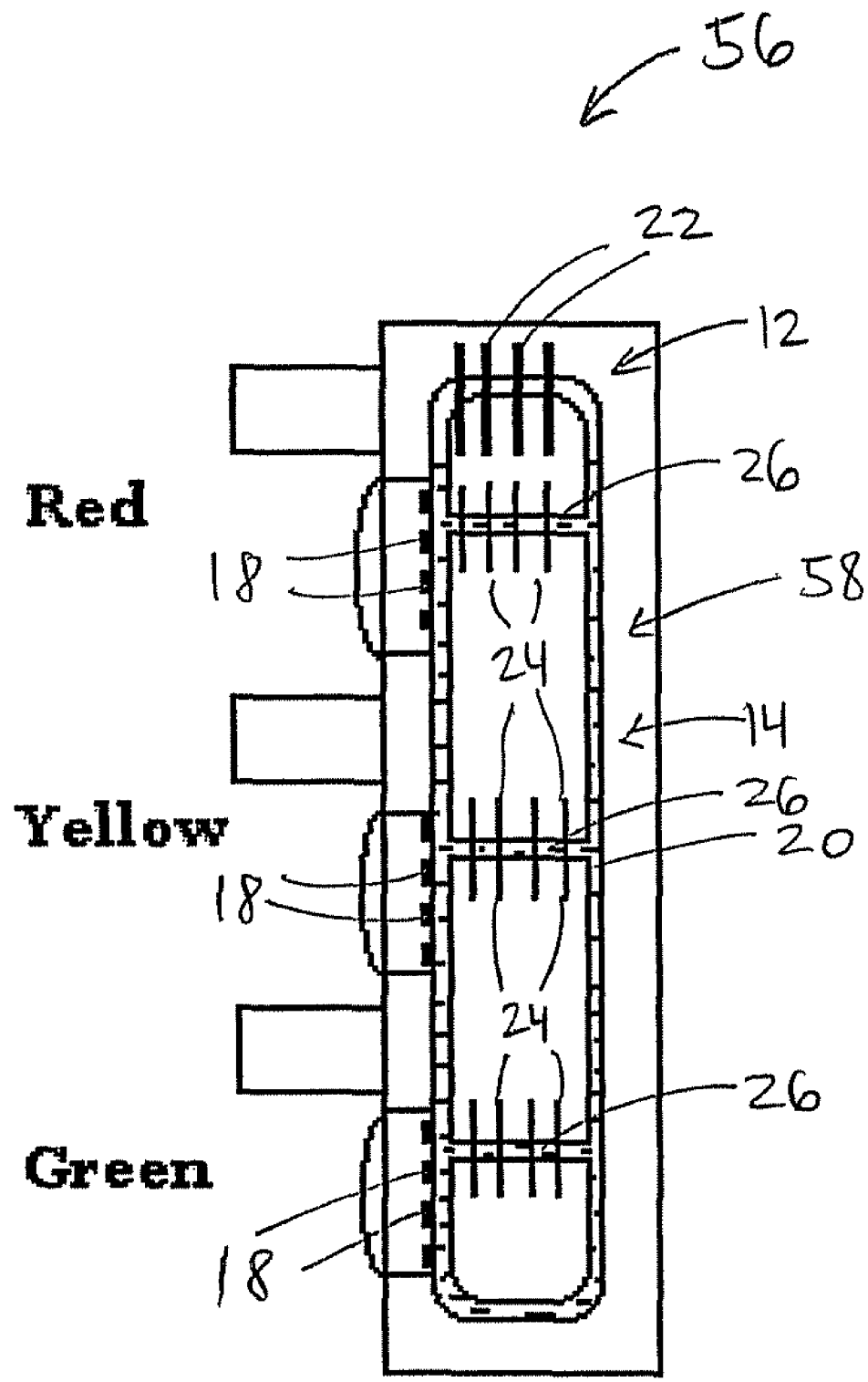
Figure 5: Traffic Light

HIGH RELIABILITY COOLING SYSTEM FOR LED LAMPS USING DUAL MODE HEAT TRANSFER LOOPS

CROSS REFERENCE TO RELATED APPLICATIONS

This application claims priority from, and hereby incorporates by reference, U.S. provisional application Ser. No. 61/003,548, filed Nov. 16, 2007, to Khanh Dinh, entitled "LED cooling with heat transfer loops."

BACKGROUND OF THE INVENTION

Light Emitting Diode (LED) lamps are solid state devices that emit light with high efficiency. However, they do not survive high operating temperatures above 120 C, and their efficiency and reliability drop drastically as their temperatures rise above 80 C. In comparison, an incandescent lamp operates successfully above 1200 C. Accordingly, heat dissipation from LEDs is an important problem to address in order to insure long life, reliability, and efficient operation of LED lamps.

A conventional conduction heat sink that consists of a relatively heavy piece of metal with high thermal conductivity, such as aluminum or copper, sometimes having air cooled fins, is marginally applicable for low intensity LED lamps, while high intensity LEDs need more efficient cooling methods such as liquid cooling or heat pipe cooling.

Liquid cooling of electronic components is well known, as taught in U.S. Pat. No. 6,055,154, wherein the back of an electronic chip is exposed to a current of cooling fluid moved by a pump. The concept of liquid cooling by impingement of water jets against the back of a heat sink is shown in U.S. Pat. No. 5,316,075. Although quite effective, liquid cooling requires the use of coolant pumps, controls, blowers or fans, and is therefore quite expensive.

Cooling using a phase change process, such as by using a heat pipe, is also known, as taught in U.S. Pat. Nos. 7,210,832; 6,926,072; 6,910,794; 6,474,074 and others. The connection of a hot chip to a heat pipe is an application in central processing unit (CPU) cooling found in many modern computers. However, most heat pipes have an internal wick structure that is expensive to manufacture and can only be justified in the cooling of high cost electronics such as CPUs. Moreover, heat pipes fail if there is a leakage of their working fluid.

BRIEF SUMMARY

In one aspect, a cooling device for an LED chip mounted on a heat sink comprises an enclosed tube in contact with the heat sink. The tube comprises a vacuum section surrounded by a plurality of cooling fins and a liquid-filled section surrounded by a plurality of cooling fins. The liquid-filled section is in contact with the heat sink.

In another aspect, an apparatus comprises a heat sink, an LED chip mounted on the heat sink, and an enclosed tube in contact with the heat sink. The tube comprises a vacuum section surrounded by a plurality of cooling fins and a liquid-filled section surrounded by a plurality of cooling fins. The liquid-filled section is in contact with the heat sink.

This Summary is provided to introduce a selection of concepts in a simplified form that are further described below in the Detailed Description. This Summary is not intended to identify key features or essential features of the claimed subject matter, is not intended to describe each disclosed embodiment or every implementation of the claimed subject matter, and is not intended to be used as an aid in determining the scope of the claimed subject matter. Many other novel advantages, features, and relationships will become apparent as this description proceeds. The figures and the description that follow more particularly exemplify illustrative embodiments.

BRIEF DESCRIPTION OF THE FIGURES

The disclosed subject matter will be further explained with reference to the attached figures, wherein like structure is referred to by like reference numerals throughout the several views.

FIG. 4A shows an exemplary embodiment of a streetlight with cooling loop.

FIG. 4B shows an exemplary embodiment of a streetlight with multiple path cooling loop.

FIG. 4C shows an exemplary embodiment of a streetlight with a cooling loop and cooling fins on the heat sink.

FIG. 5 shows an exemplary embodiment of a traffic light with cooling loop.

Figure 1:
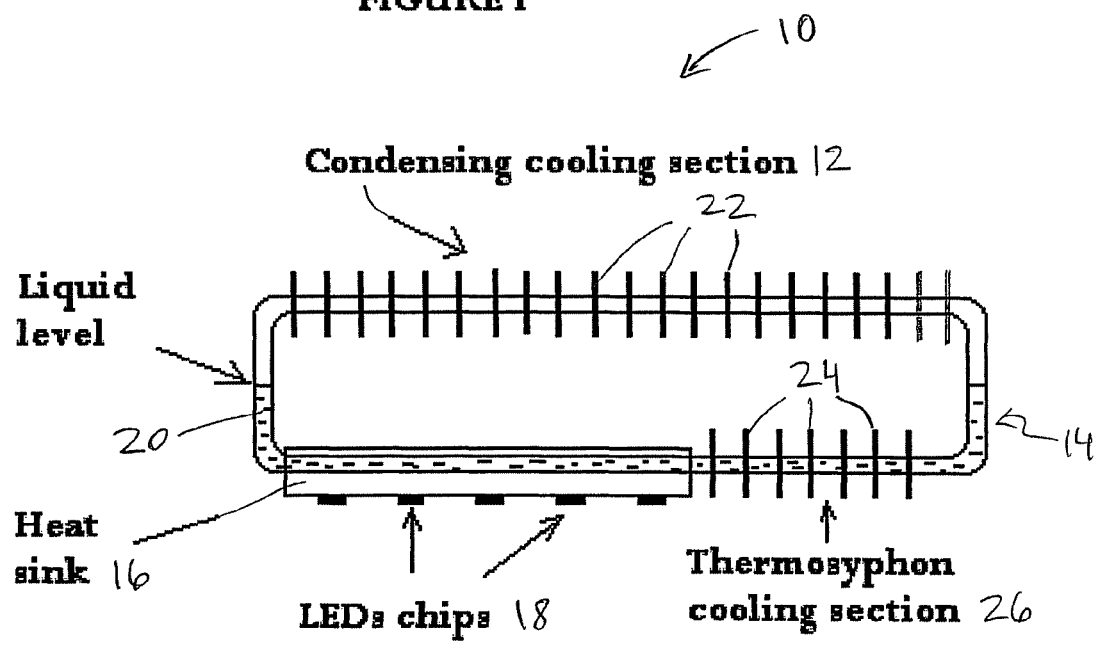
FIG. 1 shows an exemplary embodiment of an LED with a heat transfer loop having both phase change and non phase change portions.

While the above-identified figures set forth one or more embodiments of the disclosed subject matter, other embodiments are also contemplated, as noted in this disclosure. In all cases, this disclosure presents the disclosed subject matter by way of representation and not limitation. It should be understood that numerous other modifications and embodiments can be devised by those skilled in the art which fall within the scope and spirit of the principles of this disclosure.

The figures may not be drawn to scale. Moreover, where directional terms (such as above, over, left, right, under, below, etc.) are used with respect to the illustrations or in the discussion, they are used for ease of comprehension only and not as limitations. The elements of the devices may be oriented otherwise, as readily appreciated by those skilled in the art.

DETAILED DISCLOSURE

The present disclosure presents a new design of heat transfer loops that can take the heat from heat emitting devices such as LED lamps. The heat is then spread over a large area of cooling fins using phase change in conjunction with liquid circulation of a vaporizable working fluid. Exemplary embodiments of the present disclosure use low cost heat transfer loops without a wick structure. Heat pipes can transfer huge amounts of heat with very small difference of temperatures, as disclosed by Khanh Dinh in several of his patents, including, for example, U.S. Pat. Nos. 6,742,284; 6,745,830; 5,921,315; 5,845,702; 5,749,415; 5,582,246; 5,564,184; 5,448,897; 5,404,938; 5,394,040; 5,333,470; 5,269,151; 4,938,035; 4,827,733 and 4,607,498, all of which are hereby incorporated by reference. Working on the same phase change principle as heat pipes, heat pipe loops are much simpler to manufacture, since they do not require the capillary or wick structure used in heat pipes. They can be made of inexpensive piping surrounded by air-conditioning finned coils, connected together to form a gravity return loop. Moreover, exemplary embodiments of the present disclosure also use a non phase change thermo-siphon loop for added reliability. This portion of the heat dissipating device operates very similarly to liquid cooling, but does not require a pump. Instead, natural convection is used.

The combination of the two heat transfer modes, heat pipe loop and thermo-siphon, insures redundant and efficient heat transfer from the LED lamps, allowing for higher current densities, and therefore more light to be obtained from the same LED lamp, resulting in overall cost savings.

The teachings of this disclosure are different from the state of the art in that no wicking is needed, no capillary is needed, and no pump is needed. The present design is self contained and does not need a thermal contact with the housing of the lamp in order to dissipate heat to the outside, as in some other heat transfer designs that rely on the housing of the lamp to dissipate heat to the outside air.

The efficiency and durability of an LED lamp decreases drastically with increasing junction operating temperatures. For example, the light production of an LED lamp can drop as much as 30% when the junction temperature increases from 60 C to 90 C. Meanwhile, the life expectancy goes from 50,000 hours to a few thousand hours. It is therefore very advantageous to keep LED lamps operating at the lowest temperatures possible.

Whereas true heat pipes only rely on phase change to transfer heat, and therefore are practically empty of liquid except for the liquid portion of the fluid that is captured in the wick structure, the present invention uses both phase change and liquid circulation for cooling. In an exemplary embodiment, the main mechanism for heat transfer is phase change and the secondary heat transfer mechanism is liquid circulation by thermo-siphon effect. The thermo-siphon mechanism also offers a second level of safety cooling: in case of a loss of vacuum in the heat pipe, the phase change fluid, quite often water, will not change phase, and a conventional heat pipe will be totally ineffective. In contrast in exemplary embodiments of the present disclosure, by the use of thermo-siphoning effect, the claimed cooling devices will still work at a reduced rate in the event of loss of vacuum. The claimed cooling devices are similar in construction to the heat exchangers made of finned coils as taught in U.S. Patents by Dinh, listed above, and can be built using regular machine tools used in the HVAC (heating, ventilation & air conditioning) coil manufacturing industry. In contrast to the applications in HVAC, the claimed cooling devices do not have two coils exposed to the air for air-to-air heat exchange; rather, only one coil is exposed to the air and the other end of the loop is thermally connected to the LED lamp.

An exemplary embodiment of a cooling device 10 shown in FIG. 1 includes a finned condensing cooling section 12 comprising a tube section that is empty of liquid, in which vapors of the working fluid can condense and release heat by phase change. Cooling device 10 also includes a liquid filled section 14.

LED chips 18 are mounted on heat sink 16, made of copper or aluminum in exemplary embodiments. Heat generated by LED chips 18 is conducted to heat sink 16, which then transfers heat to the cooling device 10. Cooling device 10 is an enclosed tube having a vacuum section 12 and a liquid-filled section 14. In some embodiments, the tube is configured as a loop. A portion of vacuum section 12 is surrounded by cooling fins 22. A portion of liquid-filled section 14 is surrounded by cooling fins 24. Liquid-filled section 14 is in contact with heat sink 16.

In an exemplary embodiment, the working fluid 20 in the liquid filled section 14, such as water, alcohol, or a Freon family refrigerant, fills about 50% of the internal volume of the cooling device 10 and flows to the bottom of cooling device 10 by gravity. A vacuum is created in the cooling device 10 prior to installing the working fluid 20, such that there are substantially no non-condensable gases in the cooling device 10.

Under normal operation, LED chips 18 generate heat which is sufficient, because of the vacuum within cooling device 10, to cause the working fluid 20 to boil in the liquid filled section 14, creating vapors. The vapors raise to the condensing cooling section 12 of the cooling device 10 and transfer heat out of cooling device 10 via fins 22 of condensing cooling section 12. Heat is thereby transferred by phase change from LED chips 18 to the air via fins 22.

Thereafter, the vapors condense, releasing the latent heat of condensation; the condensed liquid flows by the effect of gravity to liquid filled section 14. The net effect of the evaporation-condensation cycle transfers large amounts of heat with very little temperature difference. Some heat transfer also occurs between heat sink 16 and liquid filled section 14. In an exemplary embodiment, liquid is free to move within cooling device 10. Such circulation can occur naturally by convection currents and or by an artificial method of induced circulation such as tilting, slanting, or even pumping.

Under failure mode when the vacuum in cooling device 10 is broken, such as by a leak, the working fluid 20 will be unable to boil and will heat up. This heating effect will produce a change in density that in turn will induce a thermo-siphoning effect between the heat sink 16 and fins 24 of thermo-siphon cooling section 26, thereby providing heat transfer by convection and conduction. Thermo-siphon cooling section 26 is created by attaching cooling fins 24 on a portion of liquid filled section 14.

Figure 2:
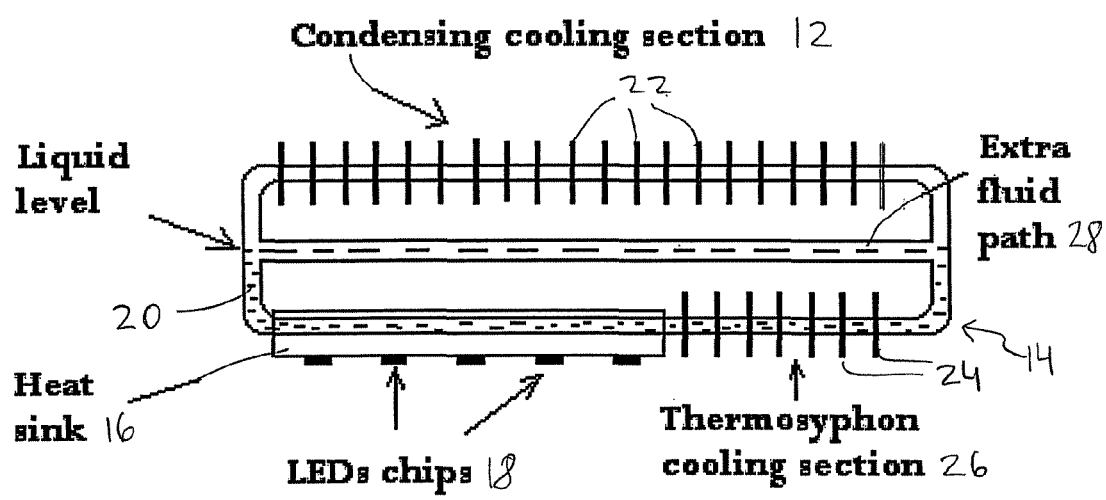
FIG. 2 shows an exemplary embodiment of a multiple path heat transfer loop design.

Multiple parallel loops may be used for redundancy. FIG. 2 shows an exemplary embodiment of a multiple path cooling device 21, including additional fluid path 28. This allows for enhanced circulation of working fluid 20 within cooling device 21. While thermo-siphon cooling section 26 in FIGS. 1 and 2 is shown on one side of LED chips 18, it could be divided into two thermo-siphon cooling sections arranged on either side of an LED lamp, as shown in FIGS. 4A, 4B, 4C, 6A, 6B, 6C and 7 for example. Other suitable arrangements are also contemplated and are within the scope of this disclosure.

Figure 3:
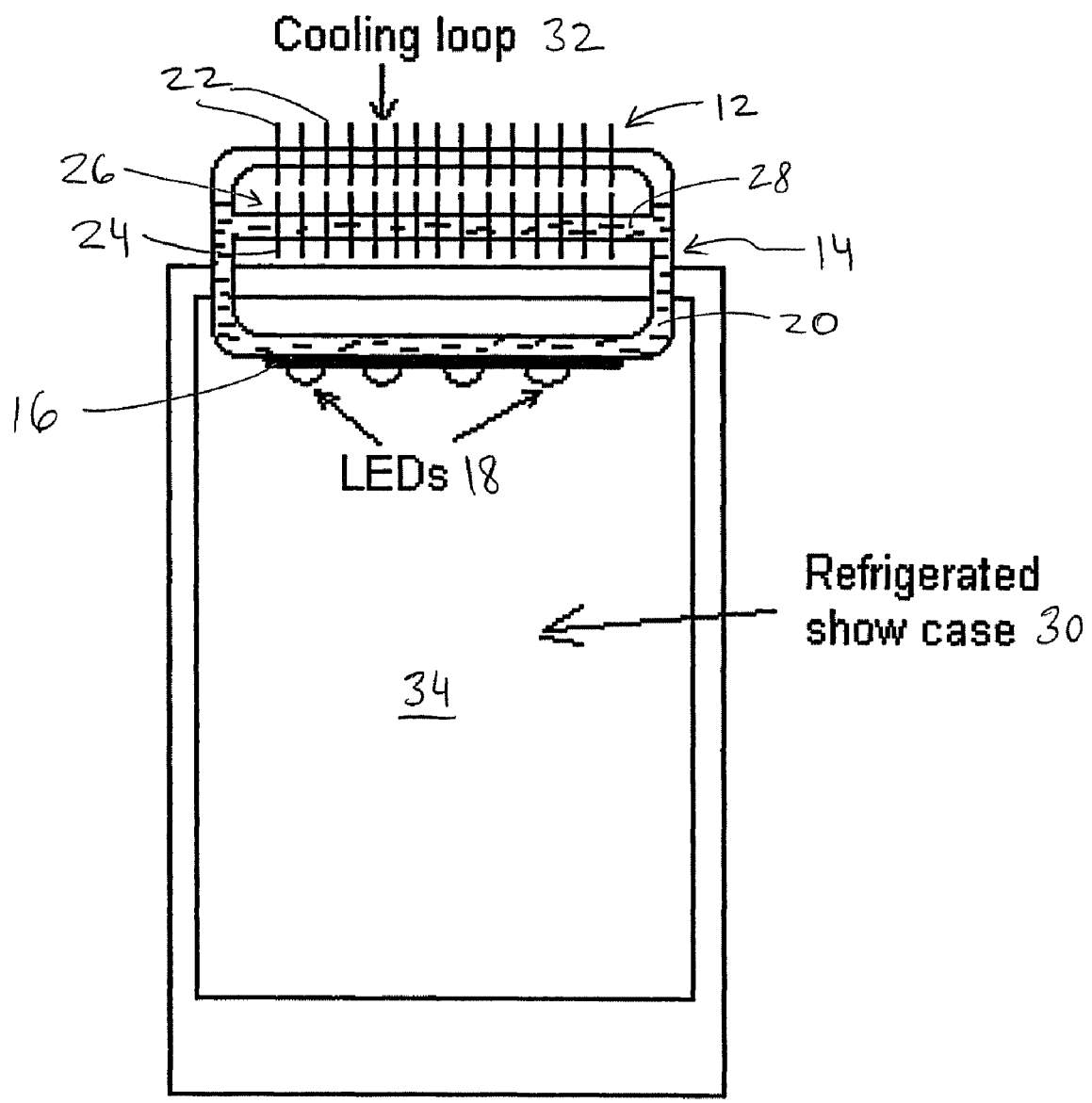
FIG. 3 shows an exemplary embodiment of an LED lighting system installed in a refrigerated show case with the heat rejection portion located outside the refrigerated space.

FIG. 3 shows an exemplary embodiment of an LED lighting system installed in a refrigerated show case 30, with the heat being transferred out of the refrigerated space by cooling loop 32, thus allowing for economization of cooling energy. In the illustrated embodiment, thermo-siphon cooling section 26 has been moved out of refrigerated space 34 to conduct heat out of that space. In an exemplary embodiment, thermo-siphon cooling section 26 is formed on fluid path 28.

FIG. 4A shows an exemplary embodiment of a streetlight 36 using cooling device 38. The illustrated streetlight shows a housing 40 that gives weather protection and allows for mounting of the streetlight 36 onto a standard electrical pole. In the illustrated embodiment, housing 40 has ventilation perforations 42 to allow for airflow into and out of housing 40 for enhanced heat dissipation. Lens 44 is also shown. FIG. 4B shows an exemplary embodiment of a streetlight 46 with multiple path cooling device 48. FIG. 4C shows streetlight 50 with a direct conduction heat sink such as an aluminum plate with cooling fins 52 that will act as an emergency cooler in case of failure of the cooling device 54. Moreover, streetlight 36, 46, 50 may include a heat sensor that senses the temperature of the LED array and causes an actuator to either turn off part of the LED array to prevent burn out, while leaving some light production for safety or lower the current density to the LED chips to dim the light output. Streetlight 36, 46, 50 may also include a photovoltaic power source panel, a storage battery or capacitor, and an optical control circuit to turn on part of the LED array at dusk and turn off at dawn. The solar addition may be used to save energy and to provide emergency lighting in case of power failure.

FIG. 5 shows an exemplary embodiment of a traffic light 56 having cool device 58. All features of the disclosed embodiments may be combined in other configurations, which are within the scope of this disclosure. For example, traffic light 56 may also include a cooling fins on a heat sink on which the LED's are mounted, similar to FIG. 4C.

Figure 6A:
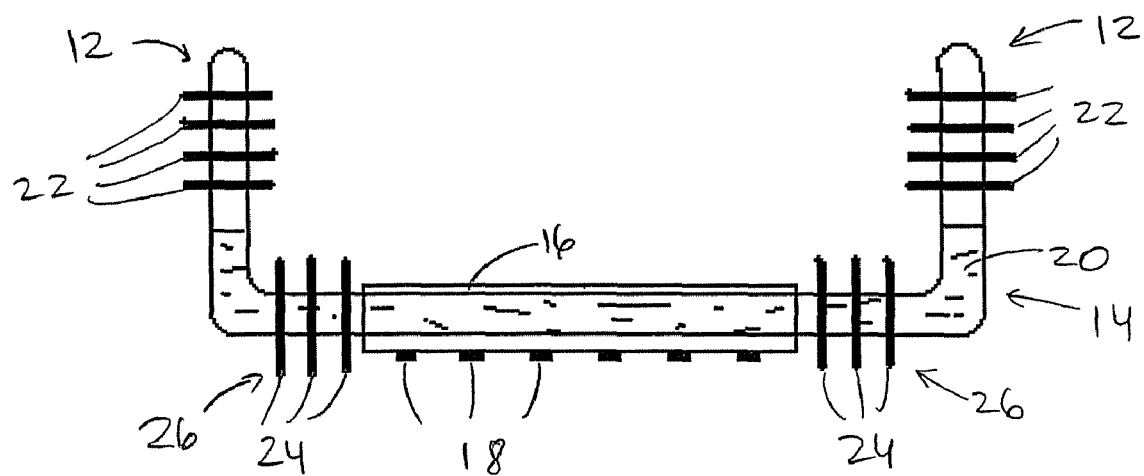
FIG. 6A shows an exemplary embodiment of a bilateral cooling tube that works with the lamp inclined either direction.
Figure 6B:
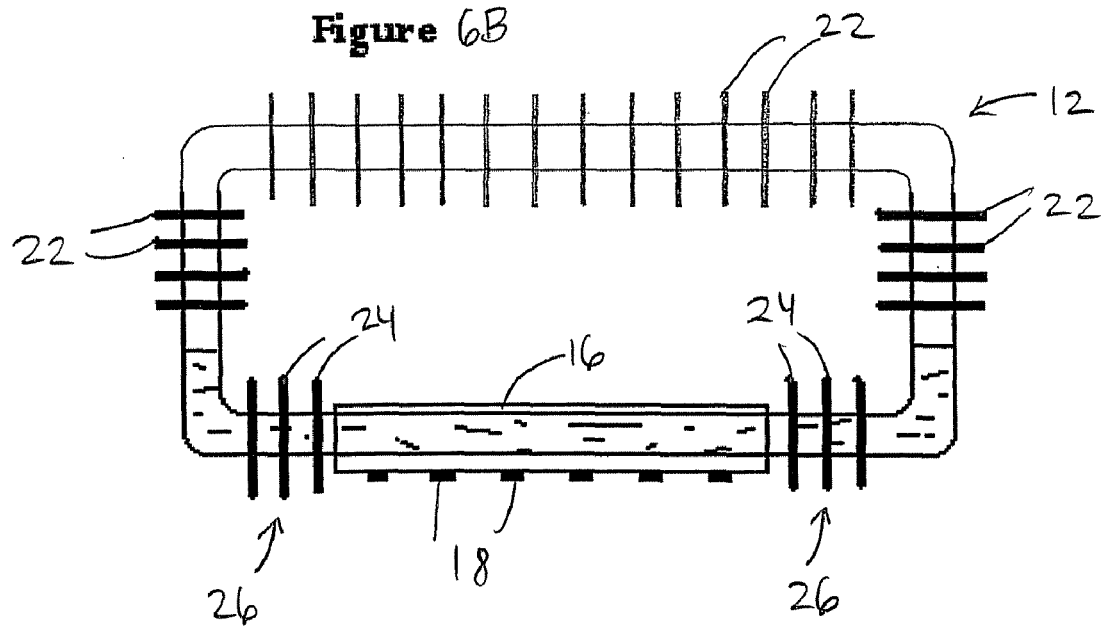
FIG. 6B shows an exemplary embodiment of a bilateral cooling loop that works with the lamp inclined either direction.
Figure 6C:
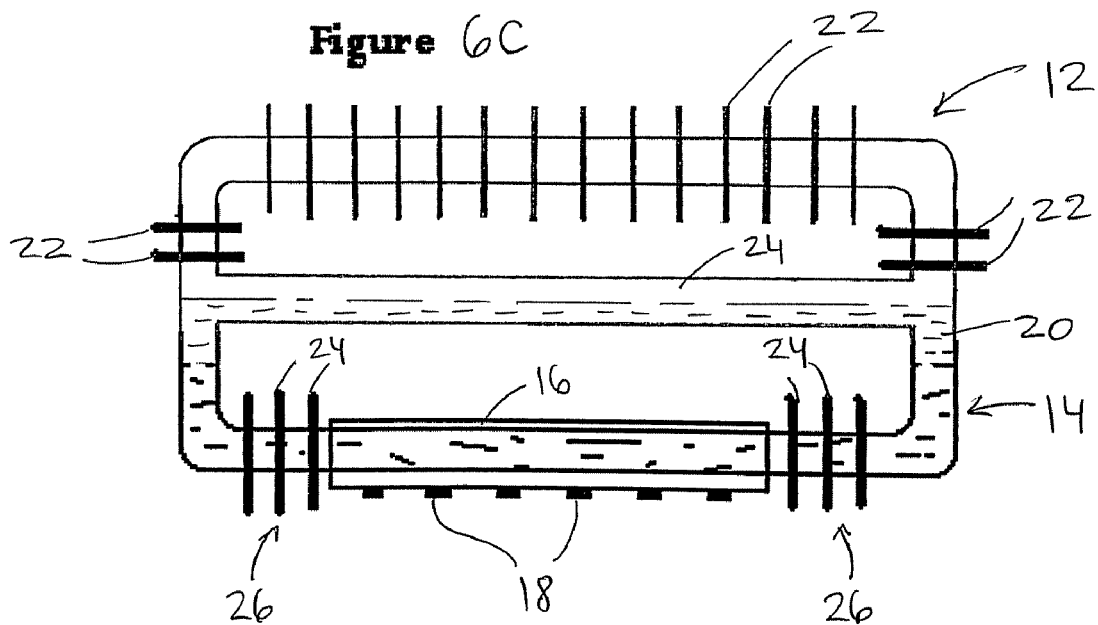
FIG. 6C shows an exemplary embodiment of a bilateral multiple path cooling loop that works with the lamp inclined either direction.
Figure 7:
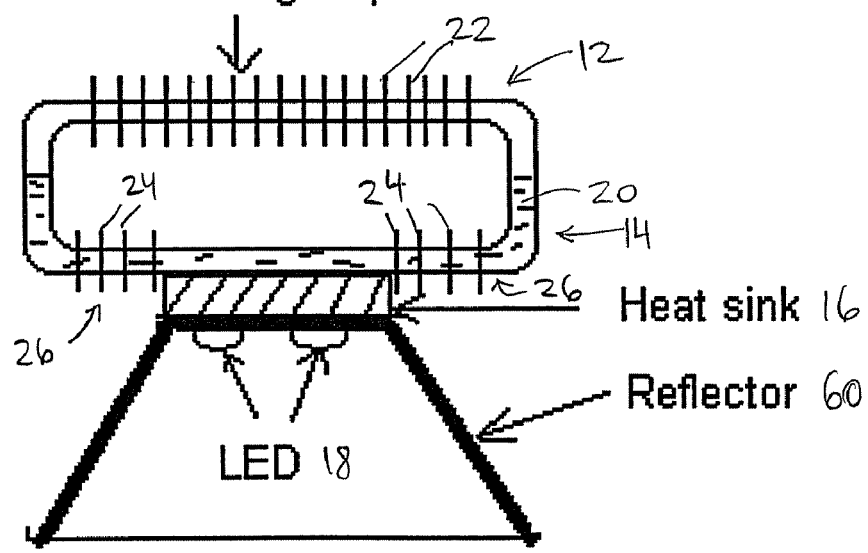
FIG. 7 shows an exemplary embodiment of a LED lamp using a heat transfer loop in conjunction with the reflector of the lamp for added cooling.

FIGS. 6A, 6B and 6C show exemplary embodiments of a bilateral cooling device that works with the lamp inclined either direction. FIG. 7 shows an exemplary embodiment of a LED lamp using a heat transfer loop in conjunction with the reflector 60 of the lamp for added cooling. Moreover, some cooling device embodiments may use an air circulating device such as a fan to move air past at least some of the plurality of cooling fins 22, 24. In some cases, the air circulating device is controlled by a temperature sensor so that the air circulating device operates only when the sensor senses a temperature exceeding a particular temperature.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. A cooling device for a heat emitting device mounted on a heat sink, the device comprising:
an enclosed tube in contact with the heat sink, wherein the heat sink is disposed in a case, the tube configured in a loop comprising an additional path within the loop, the tube comprising:
a vacuum section connected to a first plurality of cooling fins; and
a liquid-filled section connected to a second plurality of cooling fins, wherein the liquid-filled section is in contact with the heat sink, wherein a portion of the liquid-filled section connected to the second plurality of cooling fins forms a thermo-siphon cooling section on the additional path, wherein the additional path is disposed outside the case; and
wherein the liquid-filled section is disposed lower than the vacuum section due to gravity.

2. The cooling device of claim 1 wherein the heat sink comprises a third plurality of cooling fins.

3. The cooling device of claim 1 further comprising an air circulating device that moves air past at least some of the first and second plurality of cooling fins.

4. The cooling device of claim 3 wherein the air circulating device is controlled by a temperature sensor.

5. The cooling device of claim 1 wherein the case is refrigerated.

6. An apparatus comprising:
a case;
a heat sink disposed in the case;
a heat emitting device mounted on the heat sink; and
an enclosed tube in contact with the heat sink, the tube configured in a loop comprising an additional path within the loop, the tube comprising:
a vacuum section connected to a first plurality of cooling fins; and
a liquid-filled section connected to a second plurality of cooling fins, wherein the liquid-filled section is in contact with the heat sink, wherein a portion of the liquid-filled section connected to the second plurality of cooling fins forms a thermo-siphon cooling section on the additional path, wherein the additional path is disposed outside the case; and
wherein the liquid-filled section is disposed lower than the vacuum section due to gravity.

7. The apparatus of claim 6 wherein the case has a refrigerated space and wherein the additional path is disposed outside the refrigerated space.

8. The apparatus of claim 6 further comprising:
a plurality of heat emitting devices;
a temperature sensor; and
an actuator that responds to the temperature sensor by turning off only some of the plurality of heat emitting devices or by reducing a current density to at least some of the plurality of heat emitting devices.

9. The apparatus of claim 8 wherein the plurality of heat emitting devices is a plurality of LED chips.

10. The apparatus of claim 6 further comprising an air circulating device that moves air past at least some of the first and second plurality of cooling fins.

11. The apparatus of claim 10 wherein the air circulating device is controlled by a temperature sensor.

12. The apparatus of claim 6 wherein the heat emitting device is an LED chip.

* * * * *